(12) United States Patent
Iwashita et al.

(10) Patent No.: US 7,796,101 B2
(45) Date of Patent: Sep. 14, 2010

(54) ELECTROLUMINESCENT DEVICE, METHOD FOR MANUFACTURING ELECTROLUMINESCENT DEVICE, AND ELECTRONIC APPARATUS

(75) Inventors: Takahiro Iwashita, Suwa (JP); Hideto Ishiguro, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 818 days.

(21) Appl. No.: 11/668,129

(22) Filed: Jan. 29, 2007

(65) Prior Publication Data

US 2008/0036705 A1 Feb. 14, 2008

(30) Foreign Application Priority Data

Mar. 14, 2006 (JP) ............... 2006-068831

(51) Int. Cl.
*G09G 3/30* (2006.01)
(52) U.S. Cl. ...................................... 345/80
(58) Field of Classification Search .................. 345/76, 345/80, 204–206; 250/553; 313/498, 506, 313/512
See application file for complete search history.

(56) References Cited

U.S. PATENT DOCUMENTS

| | | | |
|---|---|---|---|
| 6,861,710 B2 | 3/2005 | Murakami et al. | |
| 6,992,439 B2* | 1/2006 | Yamazaki et al. | 313/512 |
| 7,033,848 B2 | 4/2006 | Murakami et al. | |
| 7,061,451 B2* | 6/2006 | Kimura | 345/76 |
| 7,215,075 B2 | 5/2007 | Kurata | |
| 7,248,235 B2* | 7/2007 | Fujii et al. | 345/76 |
| 7,466,294 B2* | 12/2008 | Yamazaki et al. | 345/83 |
| 7,492,012 B2 | 2/2009 | Murakami et al. | |
| 2004/0263066 A1* | 12/2004 | Abe et al. | 313/504 |
| 2005/0206309 A1 | 9/2005 | Shibasaki et al. | |
| 2006/0038752 A1* | 2/2006 | Winters | 345/76 |
| 2007/0216289 A1 | 9/2007 | Kuma et al. | |

FOREIGN PATENT DOCUMENTS

| | | |
|---|---|---|
| JP | A 2003-114626 | 4/2003 |
| JP | A 2003-197367 | 7/2003 |
| JP | A 2004-335207 | 11/2004 |
| JP | A 2005-266667 | 9/2005 |
| WO | WO 2005/109964 A1 | 11/2005 |

\* cited by examiner

*Primary Examiner*—Richard Hjerpe
*Assistant Examiner*—Tom V Sheng
(74) *Attorney, Agent, or Firm*—Oliff & Berridge PLC

(57) ABSTRACT

An electroluminescent device includes a substrate; a light-emitting region including a plurality of sub-pixels including switching elements, portions of an organic planarization layer for covering irregularities caused by the switching elements, reflective layers arranged on the organic planarization layer, protective layers extending over the respective reflective layers, light-transmissive first electrode layers which lie on the respective protective layers and which are electrically connected to the switching elements, portions of an organic light-emitting layer lying over the first electrode layers, and portions of a second electrode layer lying on the organic light-emitting layer; and a non-light-emitting region located outside the light-emitting region. The light-emitting region and the non-light-emitting region are arranged on the substrate. The organic planarization layer extends from the light-emitting region to the non-light-emitting region and has an upper portion which is located in the non-light-emitting region and which is exposed from the protective layers.

11 Claims, 10 Drawing Sheets

ELECTROLUMINESCENT DEVICE, METHOD FOR MANUFACTURING ELECTROLUMINESCENT DEVICE, AND ELECTRONIC APPARATUS

BACKGROUND

1. Technical Field

The present invention relates to an electroluminescent device, a method for manufacturing such an electroluminescent device, and an electronic apparatus.

2. Related Art

Organic electroluminescent (EL) devices have been attracting much attention because the organic EL devices are suitable for display units for use in electronic apparatuses such as personal computers and personal digital assistants (PDAs) and suitable for exposure heads for use in image forming apparatuses such as digital copiers and printers. Japanese Unexamined Patent Application Publication No. 2003-114626 (hereinafter referred to as Patent Document 1) discloses a top emission-type organic EL device. With reference to FIG. 10, the organic EL device includes a substrate 20; thin-film transistors 7; an organic planarization layer 25, containing an acrylic resin, for covering irregularities caused by the thin-film transistors 7; reflective layers 16 arranged on the organic planarization layer 25; light-transmissive first electrode layers 11, electrically connected to the thin-film transistors 7, lying above the reflective layers 16; an organic light-emitting layer 13 lying over the first electrode layers 11; and a second electrode layer 12 lying on the organic light-emitting layer 13, these layers and transistors being arranged above the substrate 20. The organic EL device further includes a protective layer 14 which contains silicon nitride and which lies between the reflective layers 16 and the first electrode layers 11. The protective layer 14 protects the reflective layers 16 when the first electrode layers 11 are formed by patterning a light-transmissive conductive layer. The organic EL device further includes partitions 5 which are parts of a resin layer and which extend along the boundaries between pixels 15.

In the organic EL device, since the acrylic resin for forming the organic planarization layer 25 readily absorbs moisture, moisture contained in the organic planarization layer 25 is transferred to the organic light-emitting layer 13 in some cases, thereby causing the organic light-emitting layer 13 to be degraded. The degradation of the organic light-emitting layer 13 causes defects such as dark spots and therefore is not preferable.

Therefore, as shown in FIG. 10, the organic planarization layer 25 is completely sealed with the protective layer 14 such that the moisture contained in the organic planarization layer 25 is prevented from being transferred to the organic light-emitting layer 13.

Since the protective layer 14 lies between the reflective layers 16 and the first electrode layers 11, the protective layer 14 tends to suffer from stresses caused by end portions of the first electrode layers 11 or the reflective layers 16, whereby cracks 140 are formed in the protective layer 14. This causes a problem that the moisture contained in the organic planarization layer 25 is transferred to the organic light-emitting layer 13 through the cracks 140 to cause the degradation of the organic light-emitting layer 13.

SUMMARY

An advantage of an aspect of the invention is to provide an EL device in which moisture can be prevented from being transferred to an organic light-emitting layer from an organic planarization layer covering irregularities caused by switching elements. An advantage of another aspect of the invention is to provide a method for manufacturing such an EL device. An advantage of another aspect of the invention is to provide an electronic apparatus.

An EL device according to the present invention includes a substrate; a light-emitting region including a plurality of sub-pixels including switching elements, portions of an organic planarization layer for covering irregularities caused by the switching elements, reflective layers arranged on the organic planarization layer, protective layers extending over the respective reflective layers, light-transmissive first electrode layers which lie on the respective protective layers and which are electrically connected to the switching elements, portions of an organic light-emitting layer lying over the first electrode layers, and portions of a second electrode layer lying on the organic light-emitting layer; and a non-light-emitting region located outside the light-emitting region. The light-emitting region and the non-light-emitting region are arranged on the substrate. The organic planarization layer extends from the light-emitting region to the non-light-emitting region and has an upper portion which is located in the non-light-emitting region and which is exposed from the protective layers.

A method for manufacturing the EL device includes forming the organic planarization layer, forming the reflective layers, forming the protective layers, forming the first electrode layers, and forming the organic light-emitting layer. After the first electrode layers are formed, dehydration is performed in advance of the formation of the organic light-emitting layer such that moisture is removed from the organic planarization layer.

In order to manufacture the EL device, the following layers are formed in this order: the organic planarization layer, the reflective layers, the protective layers, the first electrode layers, and the organic light-emitting layer. Since the organic planarization layer extends from the light-emitting region to the non-light-emitting region, the organic planarization layer has such an upper portion which is located in the non-light-emitting region and which is exposed from the protective layers. Therefore, after the first electrode layers are formed, dehydration is performed in advance of the formation of the organic light-emitting layer such that moisture is removed from the organic planarization layer. This allows moisture contained in a portion of the organic planarization layer that is located in the non-light-emitting region to be transferred from the light-emitting region toward the non-light-emitting region, thereby removing the moisture. This prevents the moisture contained in the organic planarization layer from permeating the organic light-emitting layer, thereby preventing the organic light-emitting layer from being degraded.

The EL device may further include a driving circuit, arranged below a zone of the organic planarization layer that is located in the non-light-emitting region, for driving the sub-pixels.

The EL device may further include partitions which are arranged on the organic planarization layer, which extend along the boundaries between the sub-pixels, and which are parts of a resin layer. A method for manufacturing the EL device according includes forming the organic planarization layer, forming the reflective layers, forming the protective layers, forming the first electrode layers, forming the partitions, and forming the organic light-emitting layer. After the partitions are formed, dehydration is performed in advance of the formation of the organic light-emitting layer such that moisture is removed from the organic planarization layer and the partitions. This allows moisture contained in the partitions to be removed. Moisture contained in a portion of the organic planarization layer that is located in the non-light-emitting region is transferred from the light-emitting region toward the non-light-emitting region, thereby removing the moisture. This prevents the moisture contained in the organic planarization layer from permeating the organic light-emitting layer, thereby preventing the organic light-emitting layer from being degraded. Since moisture is removed using the non-light-emitting region, there is a problem in that the moisture contained in the organic planarization layer can be securely removed even if sub-regions, included in the light-emitting region, for substantially emitting light have large areas and other sub-regions, included in the light-emitting region, for removing the moisture contained in the organic planarization layer have small areas.

In the EL device, the resin layer may extend from the light-emitting region to the non-light-emitting region and lie on the organic planarization layer. In this case, the moisture contained in the organic planarization layer can be removed thorough the partitions. This prevents the moisture contained in the organic planarization layer from permeating the organic light-emitting layer, thereby preventing the organic light-emitting layer from being degraded.

In the EL device, the partitions and the organic planarization layer may contain the same resin.

In the EL device, the protective layers may be spaced from each other so as to correspond to the sub-pixels and the partitions may be in contact with portions of the organic planarization layer that are located at the boundaries between the protective layers adjacent to each other. This allows the moisture contained in the organic planarization layer and the moisture contained in the partitions to be removed in the same step. Therefore, the organic light-emitting layer can be prevented from being degraded due to the permeation of the moisture in the organic planarization layer.

In the EL device, the sub-pixels may correspond to predetermined colors and the first electrode layers may have different thicknesses depending on the predetermined colors. In this case, the formation of a sub-layer and etching are repeated several times to form the first electrode layers; hence, the protective layers are necessary to protect the reflective layers. The moisture contained in the organic planarization layer can be removed through regions having no protective layers.

An electronic apparatus according to the present invention includes the EL device. The EL device is used as a display unit or exposure head in the electronic apparatus. Examples of the electronic apparatus include mobile phones, personal computers, PDAs, and image-forming apparatuses such as digital copiers and printers.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
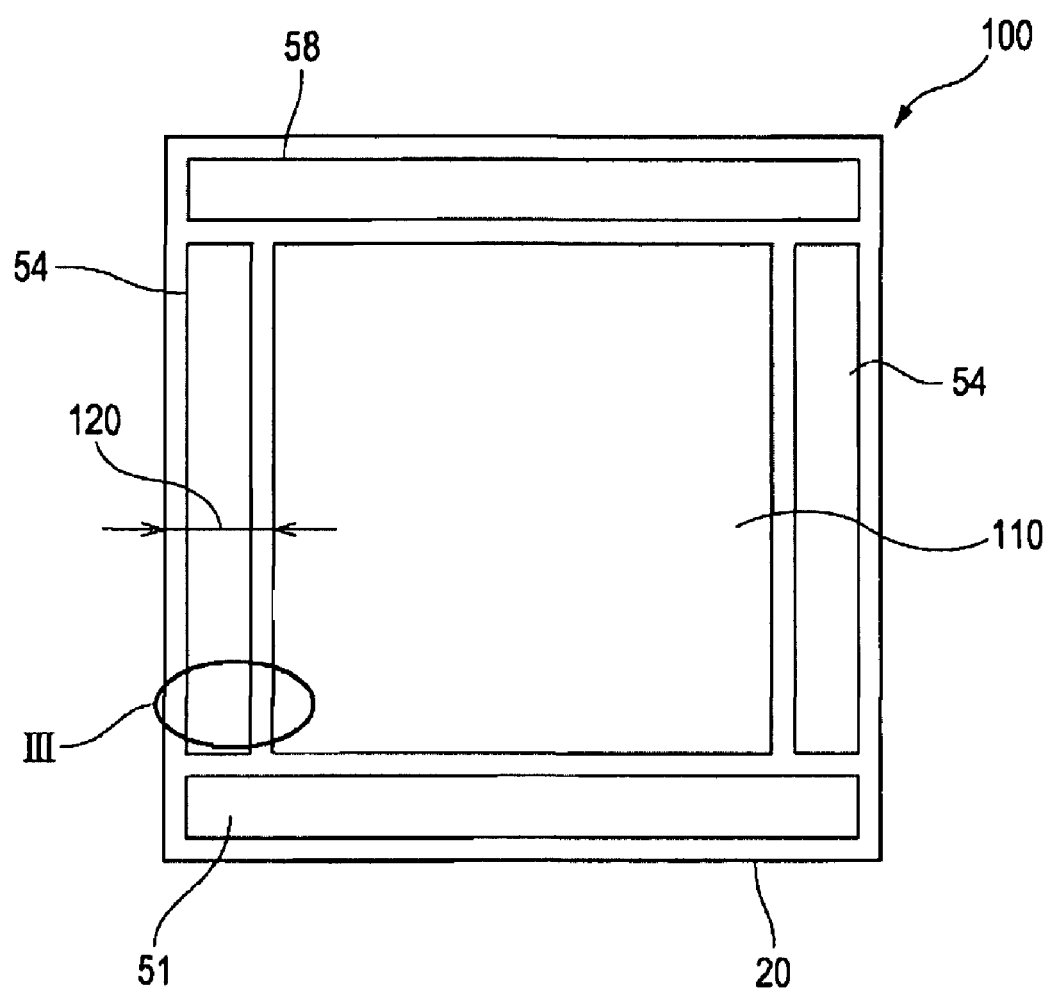
FIG. 1 is a plan view of an EL device according to a first embodiment of the present invention.

Embodiments of the present invention will now be described with reference to the accompanying drawings. In the drawings used herein, in order to show layers and members on a recognizable scale, different scales are used depending on the size of the layers and members.

First Embodiment

Figure 2:
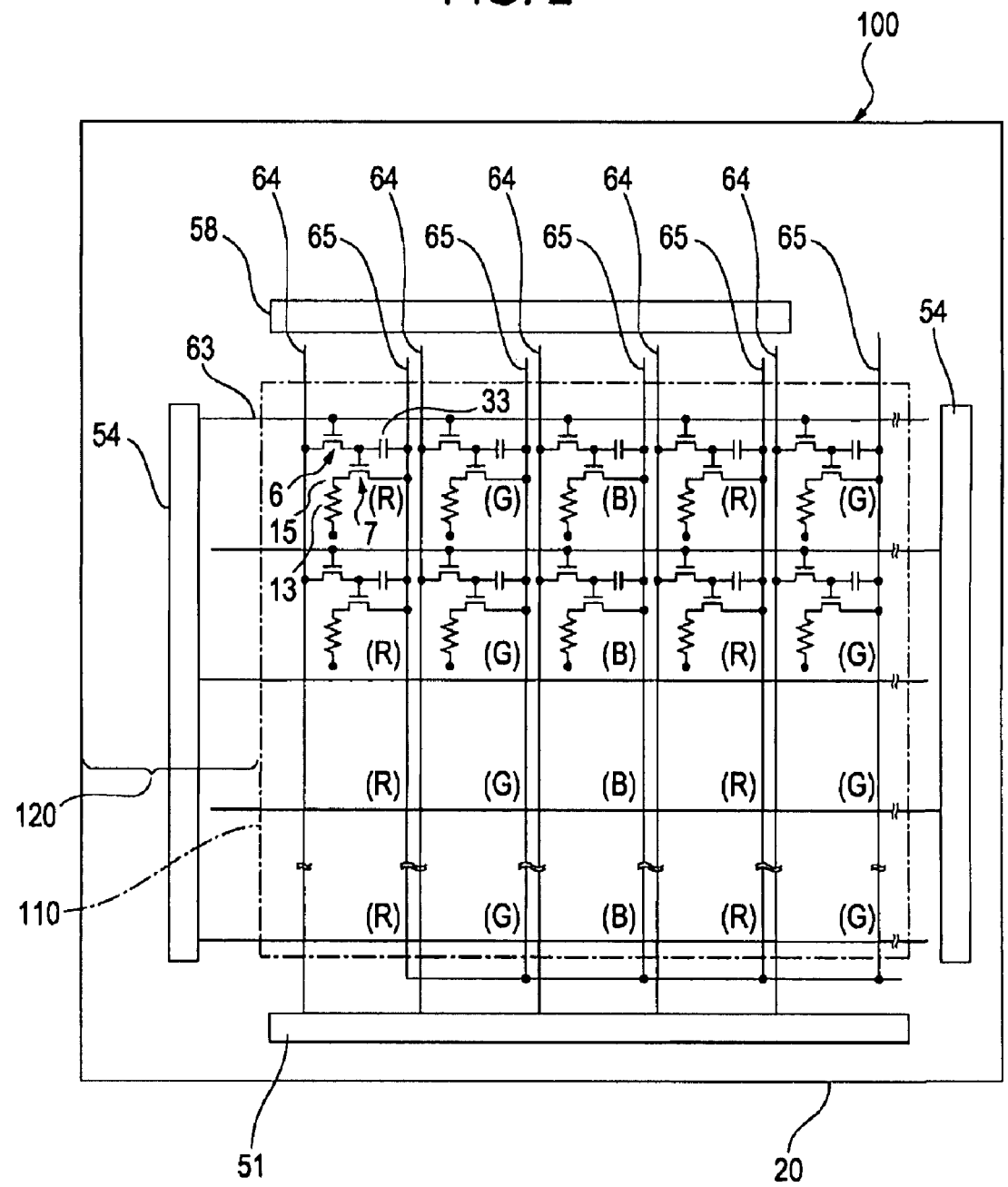
FIG. 2 is a block diagram showing electric components included in the EL device shown in FIG. 1.

An EL device according to a first embodiment of the present invention will now be described. FIG. 1 is a plan view of the EL device. FIG. 2 is a block diagram showing electric components included in the EL device.

With reference to FIGS. 1 and 2, the EL device is represented by reference numeral 100. In the EL device 100, El elements are driven to emit light by applying a driving current to an organic light-emitting layer and controlled with thin-film transistors. Since the El elements are self-luminous, a display unit including this type of EL device has advantages that the display unit requires no backlight and has a wide viewing angle. The EL device 100 includes a substrate 20, a rectangular light-emitting region 110, and a frame-shaped non-light-emitting region 120. The light-emitting region 110 and the non-light-emitting region 120 are arranged on the substrate 20. The light-emitting region 110 is located at substantially the center of the substrate 20 and includes a plurality of sub-pixels 15 arranged in matrix. The non-light-emitting region 120 surrounds the light-emitting region 110 and includes a pair of scanning line-driving circuits 54, a data line-driving circuit 51, and an inspection circuit 58. The scanning line-driving circuits 54 are arranged in opposed sub-regions of the non-light-emitting region 120. The data line-driving circuit 51 and the inspection circuit 58 are arranged in the other opposed sub-regions thereof.

The following lines extend in the light-emitting region 110: a plurality of scanning lines 63, a plurality of data lines 64 intersecting the scanning lines 63, and a plurality of feeder lines. 65 extending in parallel to the data lines 64. The sub-pixels 15 are each defined by four intersections of the scanning and data lines 63 and 64. The data lines 64 are connected to the data line-driving circuit 51. The data line-driving circuit 51 includes a shift register, a level shifter, video lines, and analogue switches. The scanning lines 63 are connected to the scanning line-driving circuits 54. The scanning line-driving circuits 54 include shift registers and level shifters. The sub-pixels 15 include first thin-film transistors 6, including gate electrodes to which scanning signals are supplied through the scanning lines 63, for switching the sub-pixels 15; hold capacitors 33 for holding image signals supplied through the data lines 64 with the first thin-film transistors 6; second thin-film transistors 7, including gate electrodes to which the image signals held in the hold capacitors 33 are supplied, for current control; and organic EL elements 10 to which driving currents are applied when the feeder lines 65 are electrically connected to the organic EL elements 10 with the thin-film transistors 7. The EL device 100 displays a color image and therefore the sub-pixels 15 correspond to red (R), green (G), and blue (B).

Figure 3A:
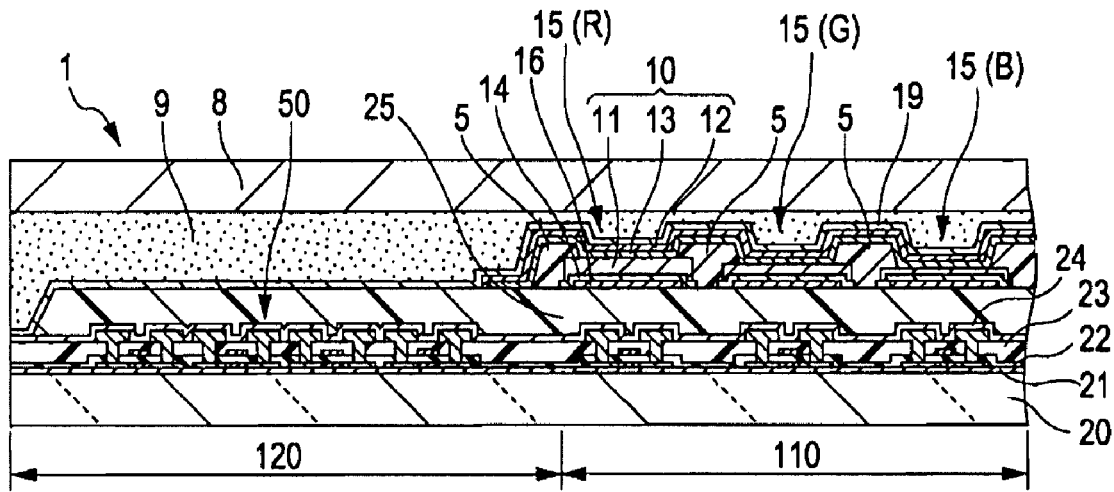
FIG. 3A is a sectional view of a principal part of the EL device of the first embodiment.
Figure 3B:
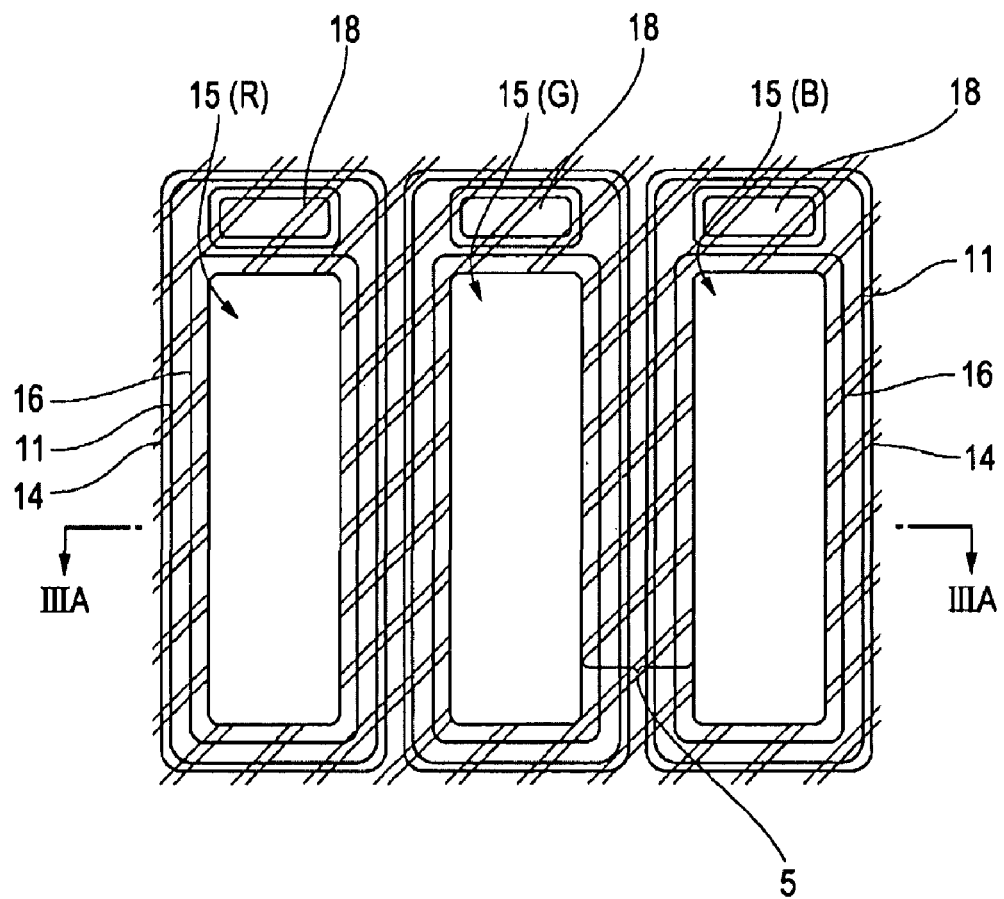
FIG. 3B is a plan view showing three sub-pixels included in the EL device of the first embodiment.
Figure 4A:
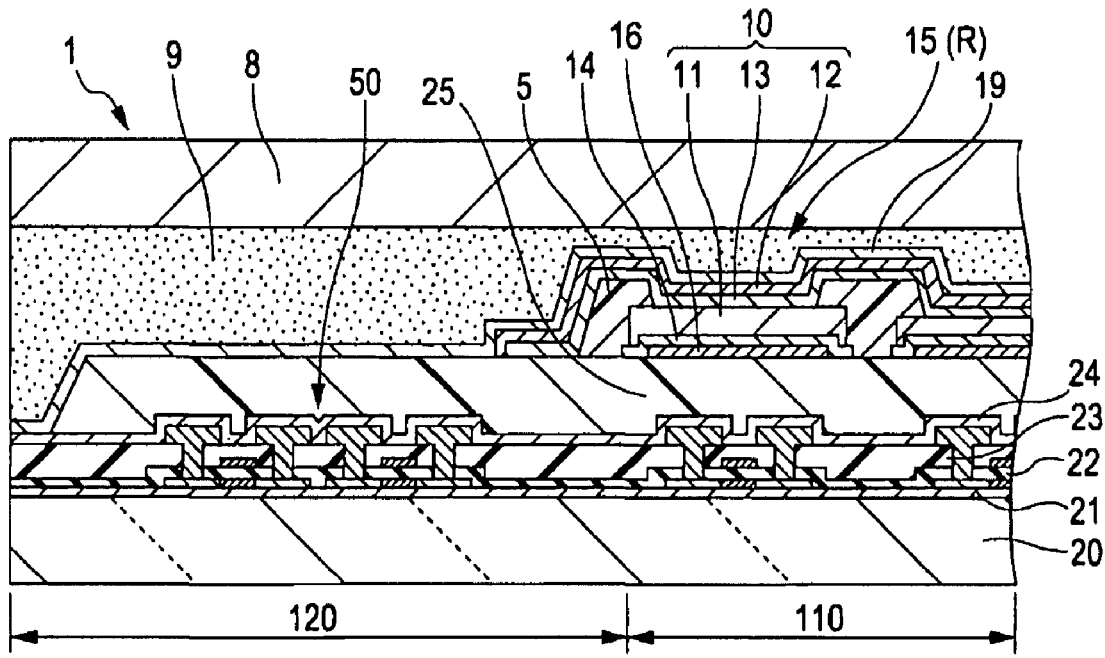
FIG. 4A is a partially enlarged view of FIG. 3A.
Figure 4B:
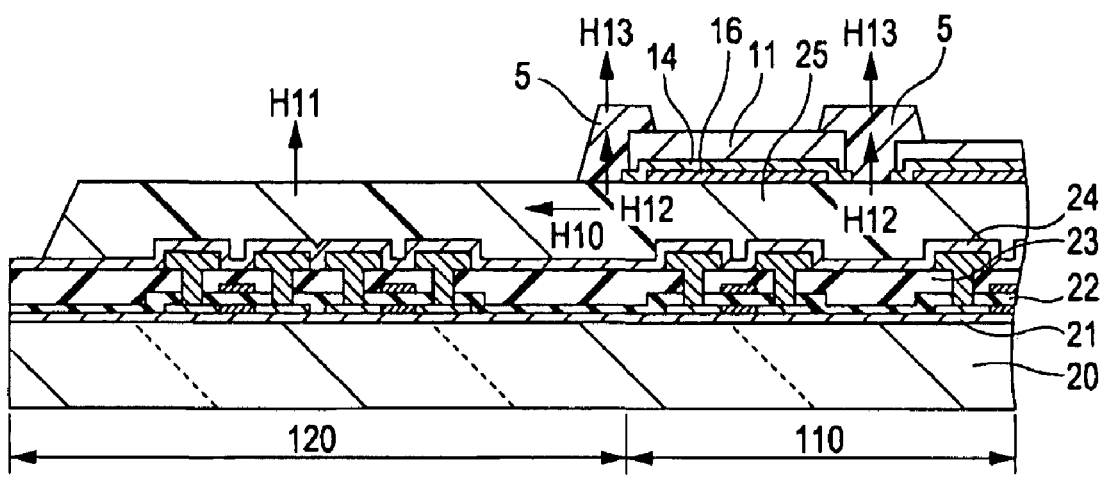
FIG. 4B is a sectional view of the EL device of the first embodiment that includes partitions.

The light-emitting region 110 will now be described in detail. FIG. 3A is a sectional view of a principal part of the EL device 100, the principal part being surrounded by circle III. FIG. 3B is a plan view showing three of the sub-pixels 15. FIG. 3A includes a cross section taken along the line IIIA-IIIA of FIG. 3B. FIG. 4A is a partially enlarged view of FIG. 3A. FIG. 4B is a sectional view of the EL device 100 including partitions 5. The number of thin-film transistors shown in FIG. 4A is less than that in FIG. 3A.

With reference to FIGS. 3A and 4A, in the EL device 100, a protective base layer 21 containing silicon dioxide or silicon nitride lies on the substrate 20, which is made of glass or the like and serves as an element substrate. In this embodiment, since the EL device 100 is a top emission type, the substrate 20 may be opaque. Examples of a material for forming the substrate 20 include ceramics such as alumina; metal sheets, such as stainless steel sheets, surface-treated to be insulative; thermosetting resins; and thermoplastic resins.

In the light-emitting region 110, the second thin-film transistors 7 are arranged on the protective base layer 21. Therefore, a gate insulating layer 22, an interlayer insulating layer 23, and a passivation layer 24 are arranged above the substrate 20 in that order.

Since the EL device 100 is a top emission type as described above, a region for forming reflective layers 16 and first electrode layers 11 needs to be planarized. Therefore, an organic planarization layer 25 lies on the passivation layer 24 to cover irregularities caused by the second thin-film transistors 7. The organic planarization layer 25 is thick and can be formed by depositing a photosensitive resin such as an acrylic resin above the substrate 20 by a sputtering process or another process.

The reflective layers 16 are arranged on the organic planarization layer 25 in a spaced manner so as to correspond to the respective sub-pixels 15. The reflective layers 16 are made of aluminum or an aluminum alloy. Protective layers 14 containing silicon nitride lie on the respective reflective layers 16. The first electrode layers 11, which serve as anodes or pixel electrodes, lie on the respective protective layers 14 and are spaced from each other. The first electrode layers 11 are light-transmissive and conductive and contain indium tin oxide (ITO) or the like. With reference to FIG. 3B, the first electrode layers 11 are electrically connected to the respective drain electrodes of the second thin-film transistors 7 through contact holes 18 extending through the protective layers 14, the organic planarization layer 25, and the passivation layer 24.

With reference to FIGS. 3A and 4A, an organic light-emitting layer 13 containing a high- or low-molecular-weight material lies over the first electrode layers 11. The organic light-emitting layer 13 is shared by the sub-pixels 15. A second electrode layer 12 having a small thickness lies over the organic light-emitting layer 13. The second electrode layer 12 contains calcium or aluminum and serves as a cathode. The second electrode layer 12 is shared by the sub-pixels 15. The sub-pixels 15 include respective organic EL elements 10 including the first electrode layers 11, portions of the second electrode layer 12, and portions of the organic light-emitting layer 13 sandwiched between the first electrode layers 11 and the second electrode layer 12.

The first electrode layers 11 have different thicknesses depending on the colors to which the sub-pixels 15 correspond. In this embodiment, the thickness of the first electrode layers 11 included in the sub-pixels 15 corresponding to red is greater than that of the first electrode layers 11 included in the sub-pixels 15 corresponding to green and the thickness of the first electrode layers 11 included in the sub-pixels 15 corresponding to green is greater than that of the first electrode layers 11 included in the sub-pixels 15 corresponding to blue, depending on the wavelength of emitted light. That is, the first electrode layers 11 serve as components of optical resonators. This allows the sub-pixels 15 to emit predetermined color lights. In order to allow the first electrode layers 11 to have such thicknesses that the sub-pixels 15 emit such color lights, deposition and etching need to be repeated several times. Therefore, the protective layers 14 are necessary to protect the reflective layers 16 from etching.

The partitions 5 are arranged on the organic planarization layer 25 such that the partitions 5 are partly disposed on the first electrode layers 11. The partitions 5, as well as the organic planarization layer 25, contain the acrylic resin and extend along the boundaries between the sub-pixels 15. Since the protective layers 14 are spaced from each other, the partitions 5 are in contact with portions of the organic planarization layer 25 that are located at the boundaries between the protective layers 14 adjacent to each other.

A sealing layer 19 containing silicon nitride lies on the second electrode layer 12 to protect the organic light-emitting layer 13 and the second electrode layer 12 from moisture and oxygen. A sealing substrate 8 is disposed above the substrate 20 with an adhesive layer 9 disposed therebetween.

The non-light-emitting region 120 will now be described in detail. In the non-light-emitting region 120, driving-circuit thin-film transistors 50 included in the data line-driving circuit 51 or scanning line-driving circuits 54 shown in FIG. 2 are arranged on the protective base layer 21. The driving-circuit thin-film transistors 50 have substantially the same configuration as that of the second thin-film transistors 7. Therefore, in the non-light-emitting region 120 as well as the light-emitting region 110, the gate insulating layer 22, the interlayer insulating layer 23, and the passivation layer 24 are arranged above the substrate 20 in that order.

In this embodiment, the organic planarization layer 25 extends from the light-emitting region 110 to the non-light-emitting region 120. However, the protective layers 14 are present only in the light-emitting region 110. Therefore, the organic planarization layer 25 has an upper portion which is located in the non-light-emitting region 120 and which is exposed from the protective layers 14. Side faces of the organic planarization layer 25 are also exposed from the protective layers 14. The sealing layer 19 extends in the non-light-emitting region 120 as well as the light-emitting region 110 and the edge of the organic planarization layer 25 is located slightly inside the edge of the substrate 20. Therefore, in the non-light-emitting region 120, the upper face and side faces of the organic planarization layer 25 are covered with the sealing layer 19 and protected by the sealing substrate 8.

Figure 5A:
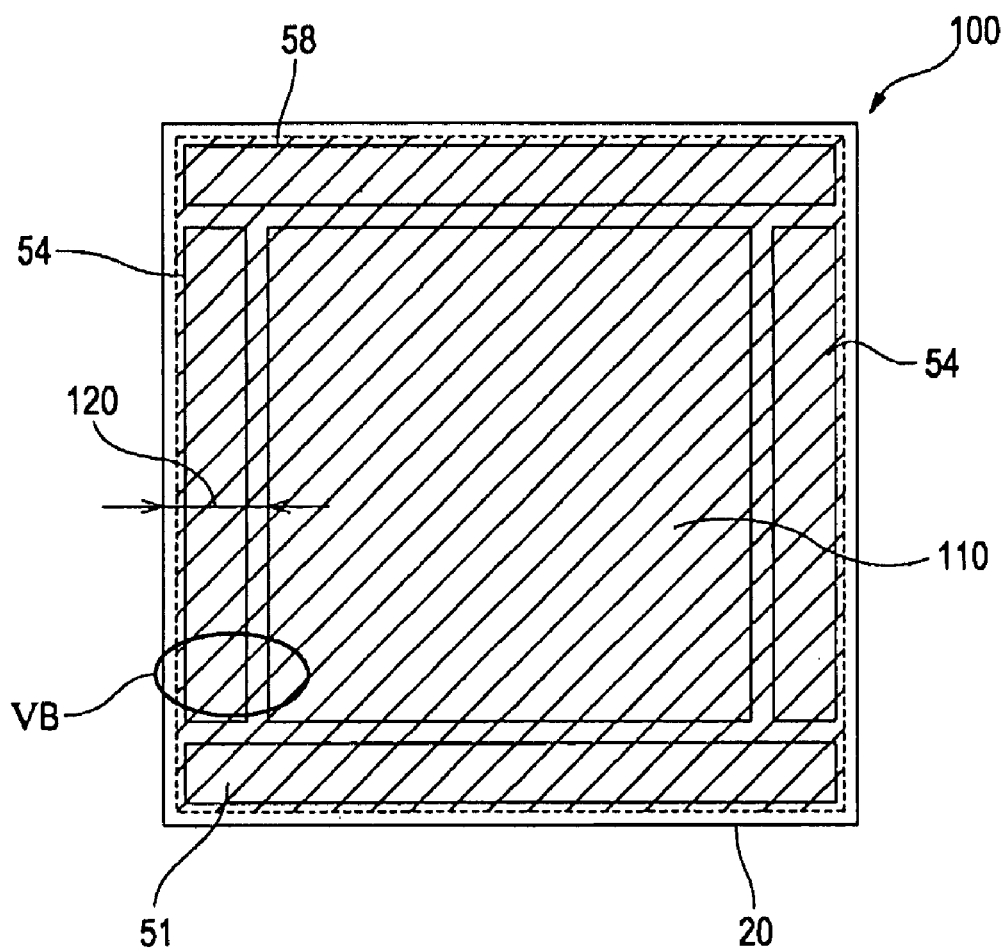
FIG. 5A is an illustration showing a region, included in the EL device of the first embodiment, for removing moisture.
Figure 5B:
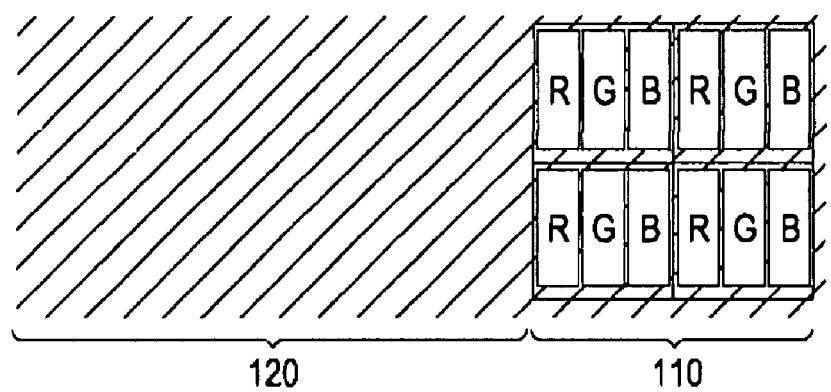
FIG. 5B is an illustration showing another region, included in the EL device of the first embodiment, for removing moisture.

Advantages of the EL device 100 will now be described in detail. FIGS. 5A and 5B are illustrations showing regions for removing moisture.

In order to manufacture the EL device 100, the following layers and partitions are formed in this order as described below with reference to FIGS. 6A to 6E: the organic planarization layer 25, the reflective layers 16, the protective layers 14, the first electrode layers 11, the partitions 5, and the organic light-emitting layer 13. Therefore, the situation between the step of forming the partitions 5 and the step of forming the organic light-emitting layer 13 is as shown in FIG. 4B. That is, the upper portion of the organic planarization layer 25 that is located in the non-light-emitting region 120 is exposed. Upper portions of the partitions 5 are also exposed. In the light-emitting region 110, the partitions 5 are in contact with portions of the organic planarization layer 25 that are located at the boundaries between the protective layers 14, included in the sub-pixels 15, adjacent to each other.

Therefore, after the partitions 5 are formed as shown in FIG. 4A, moisture can be removed from the organic planarization layer 25 and the partitions 5 in such a manner that the substrate 20 is subjected to dehydration (baking) at a predetermined temperature, for example, about 200° C., in a vacuum, although the reflective layers 16, the protective layers 14, and the first electrode layers 11 are arranged on the organic planarization layer 25 in that order.

Moisture contained in the partitions 5 is removed as indicated by Arrow H13 in FIG. 4B. Moisture contained in portions of the organic planarization layer 25 that are located in the non-light-emitting region 120 is removed as indicated by Arrow H11. Moisture contained in portions of the organic planarization layer 25 that are located in the light-emitting region 110 is transferred from the light-emitting region 110 toward the non-light-emitting region 120 as indicated by Arrow H10 and then released from the upper face of the organic planarization layer 25 as indicated by Arrow H11. Moisture contained in the portions of the organic planarization layer 25 that are located in the light-emitting region 110 is transferred to the partitions 5 through junctions between the organic planarization layer 25 and the partitions 5 as indicated by Arrow H12 and then removed as indicated by Arrow H13. That is, in this embodiment, the moisture contained in the organic planarization layer 25 can be securely removed therefrom through diagonally shaded regions, which are wide, shown in FIG. 5A or 5B.

After the EL device 100 is completed, the moisture contained in the organic planarization layer 25 is not transferred to the organic light-emitting layer 13. This prevents the organic light-emitting layer 13 from being deteriorated due to the diffusion of the moisture. Therefore, the EL device 100 has no dark spots, which are caused by the deterioration of the organic light-emitting layer 13.

In this embodiment, moisture is removed using the non-light-emitting region 120. Hence, the moisture contained in the organic planarization layer 25 can be securely removed from the EL device 100 even if sub-regions, included in the light-emitting region 110, for substantially emitting light have large areas and other sub-regions, included in the light-emitting region 110, for removing the moisture contained in the organic planarization layer 25 have small areas.

Figure 6A:
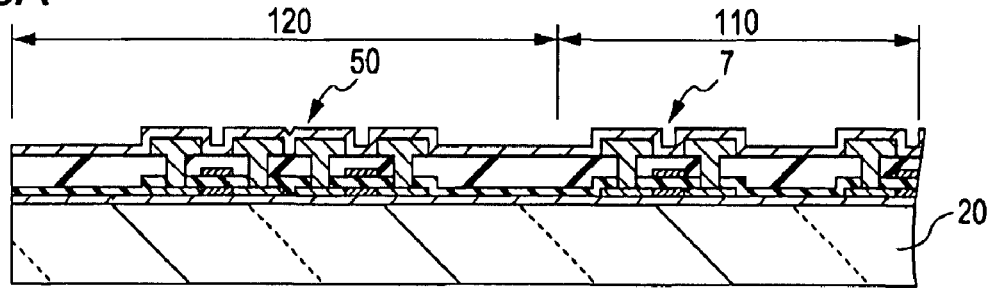
FIGS. 6A to 6E are sectional views showing steps included in a method for manufacturing the EL device of the first embodiment.

A method for manufacturing the EL device 100 will now be described with reference to FIGS. 6A to 6E. FIGS. 6A to 6E are sectional views showing steps included in the method. As shown in FIG. 6A, the second thin-film transistors 7 and the driving-circuit thin-film transistors 50 are formed above the substrate 20. In this step, a semiconductor layer for forming functional layers for forming the second thin-film transistors 7 and the driving-circuit thin-film transistors 50 is formed in such a manner that an amorphous silicon layer is formed by a plasma-enhanced chemical vapor deposition (CVD) process and then crystallized into a polysilicon layer by laser annealing or solid-phase growth.

Figure 6B:
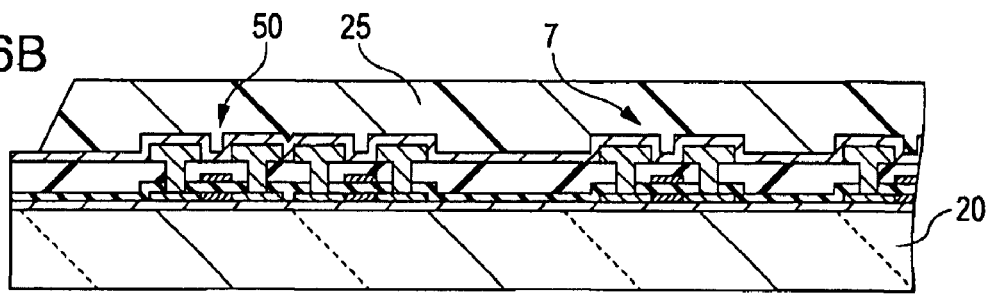

As shown in FIG. 6B, the organic planarization layer 25 is formed so as to extend from the light-emitting region 110 to the non-light-emitting region 120 in such a manner that the photosensitive acrylic resin is applied over the second thin-film transistors 7 and the driving-circuit thin-film transistors 50 by a spin-coating process and subjected to exposure and then development. The edge of the organic planarization layer 25 is located inside the edge of the substrate 20. In this step, the contact holes 18 shown in FIG. 3B are formed in the organic planarization layer 25.

Figure 6C:
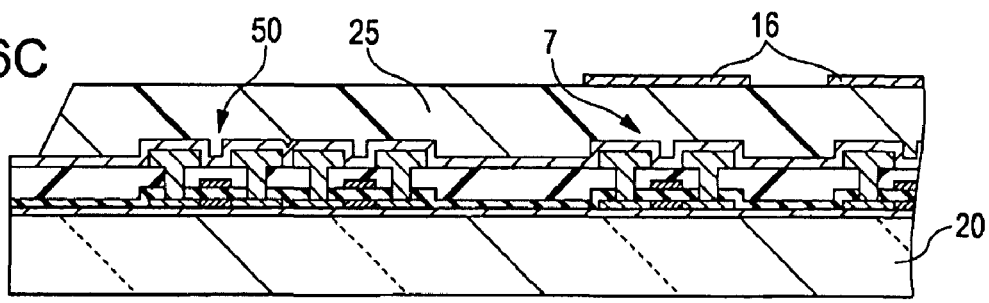

As shown in FIG. 6C, the reflective layers 16 are formed in such a manner that an aluminum layer or an aluminum alloy layer is formed on the organic planarization layer 25 by a sputtering process and then patterned by a photolithographic process.

Figure 6D:
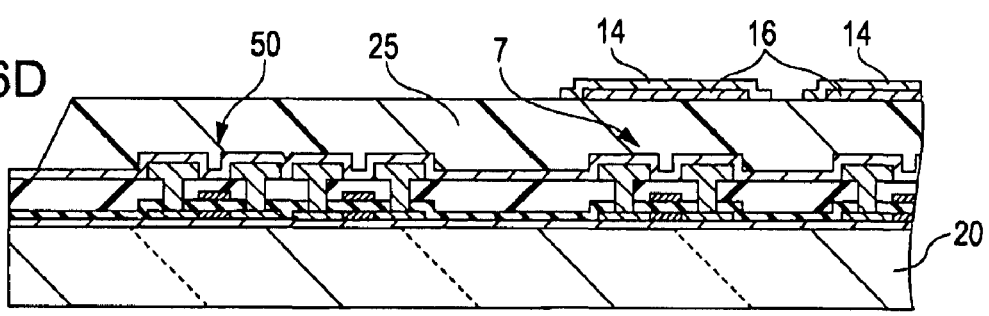

As shown in FIG. 6D, the protective layers 14 are formed in such a manner that a silicon nitride layer is formed over the reflective layers 16 by a CVD process or another process and then patterned by a photolithographic process. In this step, the contact holes 18 shown in FIG. 3B are formed in the protective layers 14.

Figure 6E:
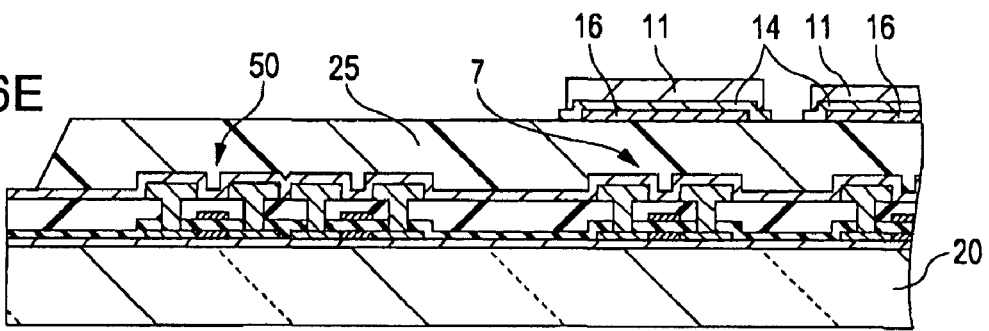

As shown in FIG. 6E, the first electrode layers 11 are formed so as to have thicknesses depending on the colors to which the sub-pixels 15 correspond. In this step, the formation of an ITO sub-layer and the sputtering of the ITO sub-layer are repeated several times. Since the reflective layers 16 are covered with the protective layers 14, the reflective layers 16 can be protected from sputtering.

As shown in FIG. 4B, the partitions 5 are formed in the light-emitting region 110 so as to extend along the boundaries between the sub-pixels 15 in such a manner that the photosensitive acrylic resin is applied over the light-emitting region 110 by a spin-coating process and subjected to exposure and then development.

The substrate 20 shown in FIG. 4B is subjected to dehydration (baking) at a predetermined temperature, for example, about 200° C., in a vacuum. This allows the moisture contained in the partitions 5 or the organic planarization layer 25 to be removed as described above with reference to FIG. 4B. All of these steps are performed in a moisture-free atmosphere.

As shown in FIG. 4A, the organic light-emitting layer 13, the second electrode layer 12, and the sealing layer 19 are formed in that order and the substrate 20 is then joined to the sealing substrate 8 with the adhesive layer 9 disposed therebetween. In this embodiment, the organic light-emitting layer 13 may contain the low- or high-molecular-weight material. When the high-molecular-weight material is used, the organic light-emitting layer 13 can be formed by the following technique: a technique in which droplets of a liquid composition containing the high-molecular-weight material are applied to predetermined regions above the substrate 20 and then solidified or a technique in which a layer of the liquid composition is formed over the substrate 20 by a spin-coating process and then patterned. When the low-molecular-weight material is used, the organic light-emitting layer 13 can be formed by the following technique: a technique in which the low-molecular-weight material is selectively deposited on necessary regions above the substrate 20 using a mask or a technique in which a layer of the low-molecular-weight material is formed over the substrate 20 by vapor deposition and then patterned. The organic light-emitting layer 13 may have a single-layer or multilayer structure. When the organic light-emitting layer 13 has such a multilayer structure, the organic light-emitting layer 13 includes a hole injection sub-layer and a light-emitting sub-layer. The hole injection sub-layer contains 3,4-polyethylenedioxythiophene (PEDOT) and polystyrenesulfonic acid (PSS). The light-emitting sub-layer contains a polymer such as a polyfluorene derivative, a polyphenylene derivative, a polyvinylcarbazole derivative, or a polythiophene derivative. The polymer may be doped with a perylene, coumarin, or rhodamine dye such as rubrene, perylene, 9,10-diphenylanthracene, tetraphenylbutadiene, Nile red, coumarin-6, or quinacridone.

Second Embodiment

Figure 7A:
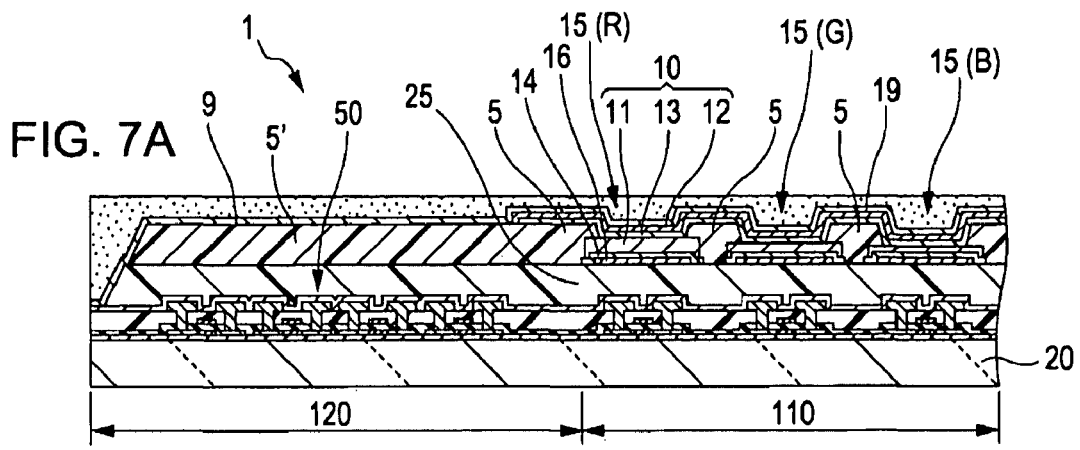
FIG. 7A is a sectional view of a principal part of an EL device according to a second embodiment of the present invention.
Figure 7B:
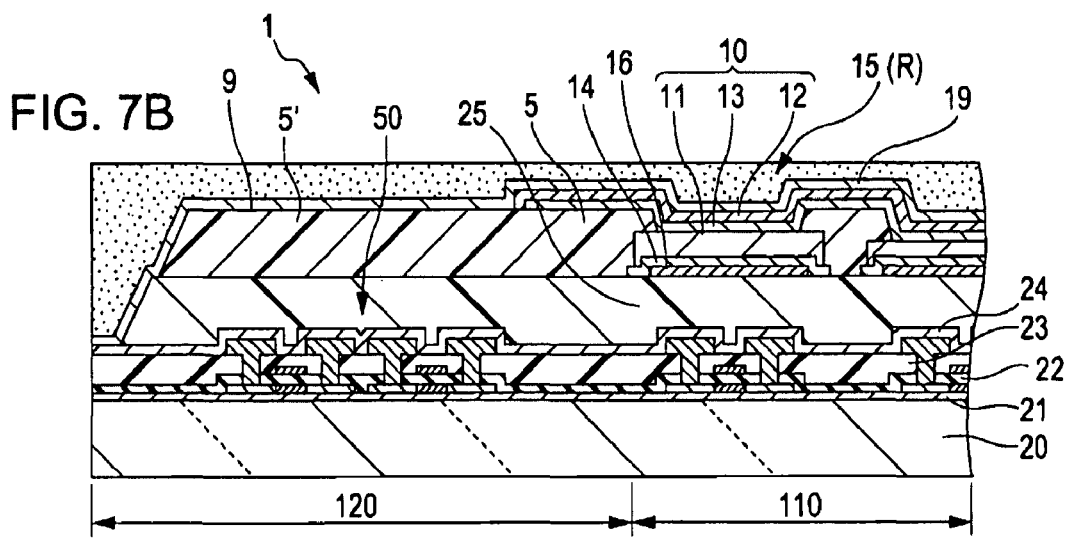
FIG. 7B is an enlarged sectional view of the principal part of the EL device of the second embodiment.
Figure 7C:
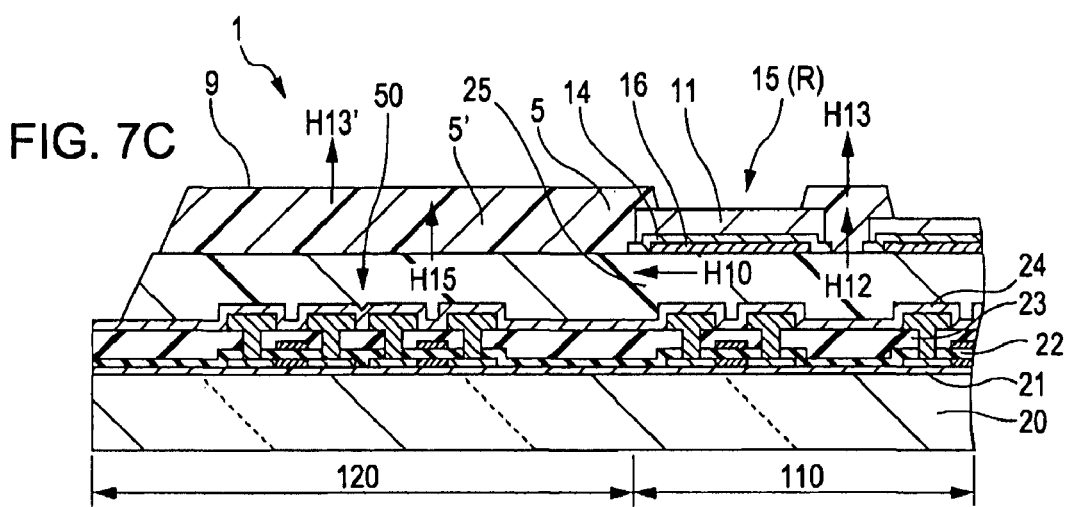
FIG. 7C is a sectional view of the EL device of the second embodiment that includes partitions.

An EL device according to a second embodiment of the present invention will now be described. FIG. 7A is a sectional view of a principal part of the EL device. FIG. 7B is an enlarged sectional view of the principal part thereof. FIG. 7C is a sectional view of the EL device including partitions. FIGS. 7A, 7B, and 7C correspond to FIGS. 3A, 4A, and 4B, respectively. The EL device of this embodiment has a configuration similar to that of the EL device of the first embodiment. Hence, the same components shown in these figures have the same reference numerals and are not described in detail.

With reference to FIGS. 7A and 7B, the EL device is represented by reference numeral 100. The EL device 100 of this embodiment, as well as the EL device 100 of the first embodiment, is a top emission type and therefore a region for forming reflective layers 16 and first electrode layers 11 needs to be planarized. Hence, an organic planarization layer 25 lies above a substrate 20 to cover irregularities caused by second thin-film transistors 7. The organic planarization layer 25 is thick and contains a photosensitive resin such as an acrylic resin. The reflective layers 16 are arranged on the organic planarization layer 25 so as to correspond to respective sub-pixels 15. The reflective layers 16 are made of aluminum or an aluminum alloy and spaced from each other. Protective layers 14 containing silicon nitride lie on the respective reflective layers 16. The first electrode layers 11, which serve as anodes or pixel electrodes, are arranged on the respective protective layers 14 in a spaced manner. The first electrode layers 11 are light-transmissive and conductive and contain indium tin oxide (ITO) or the like. An organic light-emitting layer 13 containing a high- or low-molecular-weight material lies over the first electrode layers 11. The organic light-emitting layer 13 is shared by the sub-pixels 15. A second electrode layer 12 having a small thickness lies over the organic light-emitting layer 13. The second electrode layer 12 contains calcium or aluminum and serves as a cathode. The second electrode layer 12 is shared by the sub-pixels 15. The sub-pixels 15 include respective organic EL elements 10 including the first electrode layers 11, portions of the second electrode layer 12, and portions of the organic light-emitting layer 13 sandwiched between the first electrode layers 11 and the second electrode layer 12. In this embodiment, the first electrode layers 11 have different thicknesses depending on colors to which the sub-pixels 15 correspond. Partitions 5 containing an acrylic resin are arranged on the organic planarization layer 25 such that the partitions 5 are partly disposed on the first electrode layers 11. The partitions 5 extend along the boundaries between the sub-pixels 15. Since the protective layers 14 are spaced from each other, the partitions 5 are in contact with portions of the organic planarization layer 25 that are located at the boundaries between the protective layers 14 adjacent to each other. A sealing layer 19 containing silicon nitride lies on the second electrode layer 12 to protect the organic light-emitting layer 13 and the second electrode layer 12 from moisture and oxygen. A sealing substrate 8 is disposed above the substrate 20 with an adhesive layer 9 disposed therebetween. In this embodiment, in a non-light-emitting region 120, driving-circuit thin-film transistors 50 included in data line-driving circuit 51 or scanning line-driving circuits 54 shown in FIG. 2 are arranged on a protective base layer 21. The driving-circuit thin-film transistors 50 have substantially the same configuration as that of the second thin-film transistors 7. Therefore, in the non-light-emitting region 120, a gate insulating layer 22, an interlayer insulating layer 23, and a passivation layer 24 are arranged above the substrate 20 in that order.

In this embodiment as well as the first embodiment, the organic planarization layer 25 extends from a light-emitting region 110 to the non-light-emitting region 120. However, the protective layers 14 are arranged only in the light-emitting region 110. Therefore, the upper portion of the organic planarization layer 25 that is located in the non-light-emitting region 120 is exposed from the protective layers 14.

This embodiment is different from the first embodiment in that an acrylic resin layer 51 for forming the partitions 5 extends from the light-emitting region 110 to non-light-emitting region 120. The acrylic resin layer 5' is in contact with on a portion of the organic planarization layer 25 that is located in the non-light-emitting region 120.

The sealing layer 19 extends in the non-light-emitting region 120 as well as the light-emitting region 110. The edge of the organic planarization layer 25 and the edge of the acrylic resin layer 51 are located slightly inside the edge of the substrate 20. Therefore, in the non-light-emitting region 120, the following faces are covered with the sealing layer 19: the upper face and side faces of the acrylic resin layer 5' and side faces of the organic planarization layer 25.

In order to manufacture the EL device 100 having the above configuration, the following layers and partitions are formed in this order: the organic planarization layer 25, the reflective layers 16, the protective layers 14, the first electrode layers 11, the partitions 5, and the organic light-emitting layer 13. Therefore, the situation between the step of forming the partitions 5 and the step of forming the organic light-emitting layer 13 is as shown in FIG. 7C. That is, in the non-light-emitting region 120, the upper face of the organic planarization layer 25 is covered with the acrylic resin layer 5' and the upper face of the acrylic resin layer 51 is exposed. Upper portions of the partitions 5 are also exposed. In the light-emitting region 110, the partitions 5 are in contact with portions of the organic planarization layer 25 that are located at the boundaries between the protective layers 14, included in the sub-pixels 15, adjacent to each other.

Therefore, after the partitions 5 are formed as shown in FIG. 7C, moisture can be removed from the organic planarization layer 25 and the partitions 5 in such a manner that the substrate 20 is subjected to dehydration (baking) at a predetermined temperature, for example, about 200° C., in a vacuum, although the reflective layers 16, the protective layers 14, and the first electrode layers 11 are arranged on the organic planarization layer 25. That is, moisture contained in the partitions 5 is removed as indicated by Arrow H13 in FIG. 7C. Moisture contained in portions of the organic planarization layer 25 that are located in the non-light-emitting region 120 is transferred to the acrylic resin layer 51 as indicated by Arrow H15 and then removed as indicated by Arrow H13'. Moisture contained in portions of the organic planarization layer 25 that are located in the light-emitting region 110 is transferred from the light-emitting region 110 toward the non-light-emitting region 120 as indicated by Arrow H10, transferred to the acrylic resin layer 5' as indicated by Arrow H15, and then removed as indicated by Arrow H13'. Alternatively, the moisture contained in the portions of the organic planarization layer 25 that are located in the light-emitting region 110 is transferred to the partitions 5 through the junctions between the partitions 5 and the organic planarization layer 25 as indicated by Arrow H12 and then removed as indicated by Arrow H13. That is, the moisture contained in the organic planarization layer 25 can be securely removed therefrom through diagonally shaded regions, which are wide, shown in FIG. 5A or 5B. Therefore, after the organic EL elements 10 is completed as shown in FIGS. 7A and 7B, the moisture contained in the organic planarization layer 25 is not transferred to the organic light-emitting layer 13. This prevents the organic light-emitting layer 13 from being deteriorated due to the diffusion of the moisture. Therefore, the EL device 100 has no dark spots, which are caused by the deterioration of the organic light-emitting layer 13.

In this embodiment, moisture is removed using the non-light-emitting region 120. Hence, the moisture contained in the organic planarization layer 25 can be securely removed from the EL device 100 even if sub-regions, included in the light-emitting region 110, for substantially emitting light have large areas and other sub-regions, included in the light-emitting region 110, for removing the moisture contained in the organic planarization layer 25 have small areas.

Third Embodiment

Figure 8A:
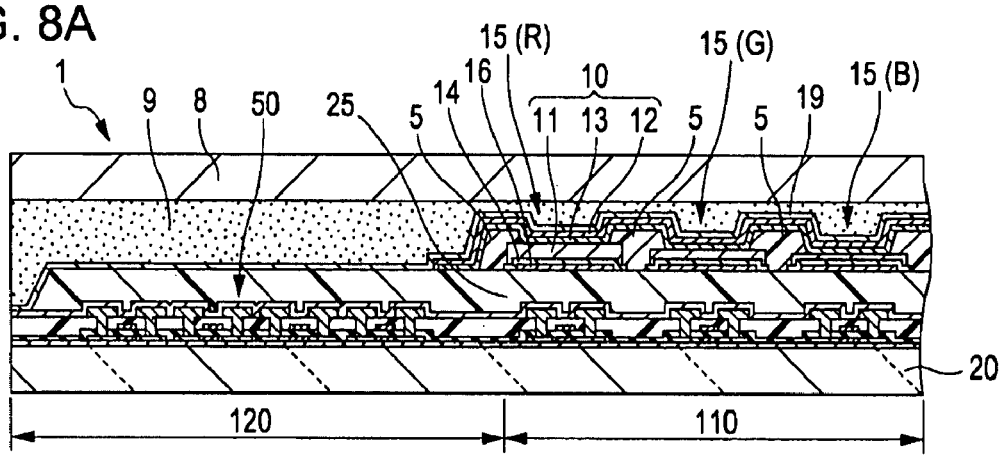
FIG. 8A is a sectional view of a principal part of an EL device according to a third embodiment of the present invention.
Figure 8B:
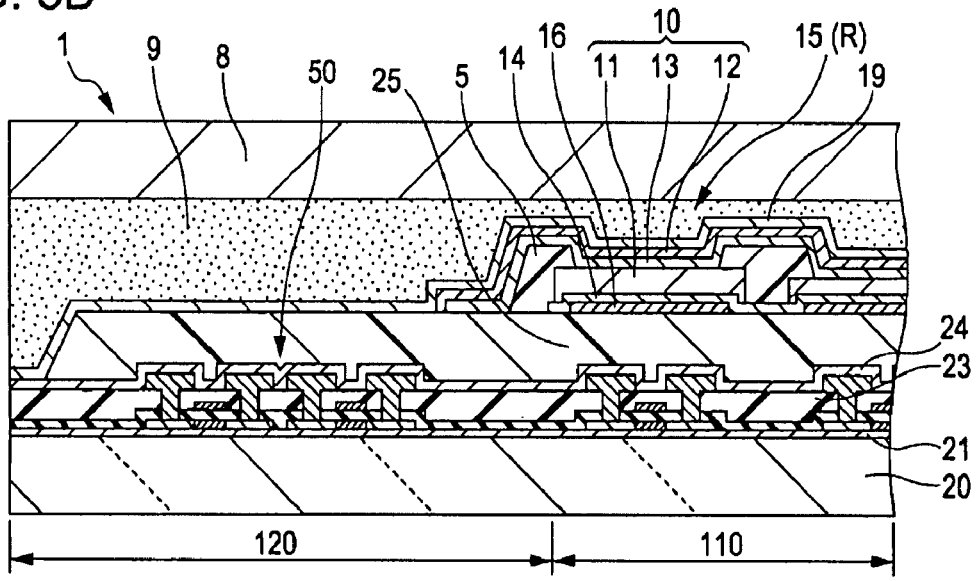
FIG. 8B is an enlarged sectional view of the principal part of the EL device of the third embodiment.
Figure 8C:
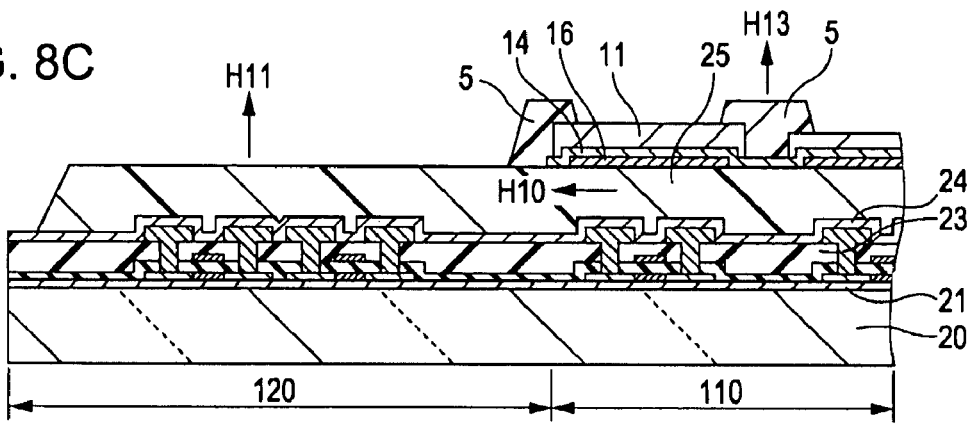
FIG. 8C is a sectional view of the EL device of the third embodiment that includes partitions.
Figure 9A:
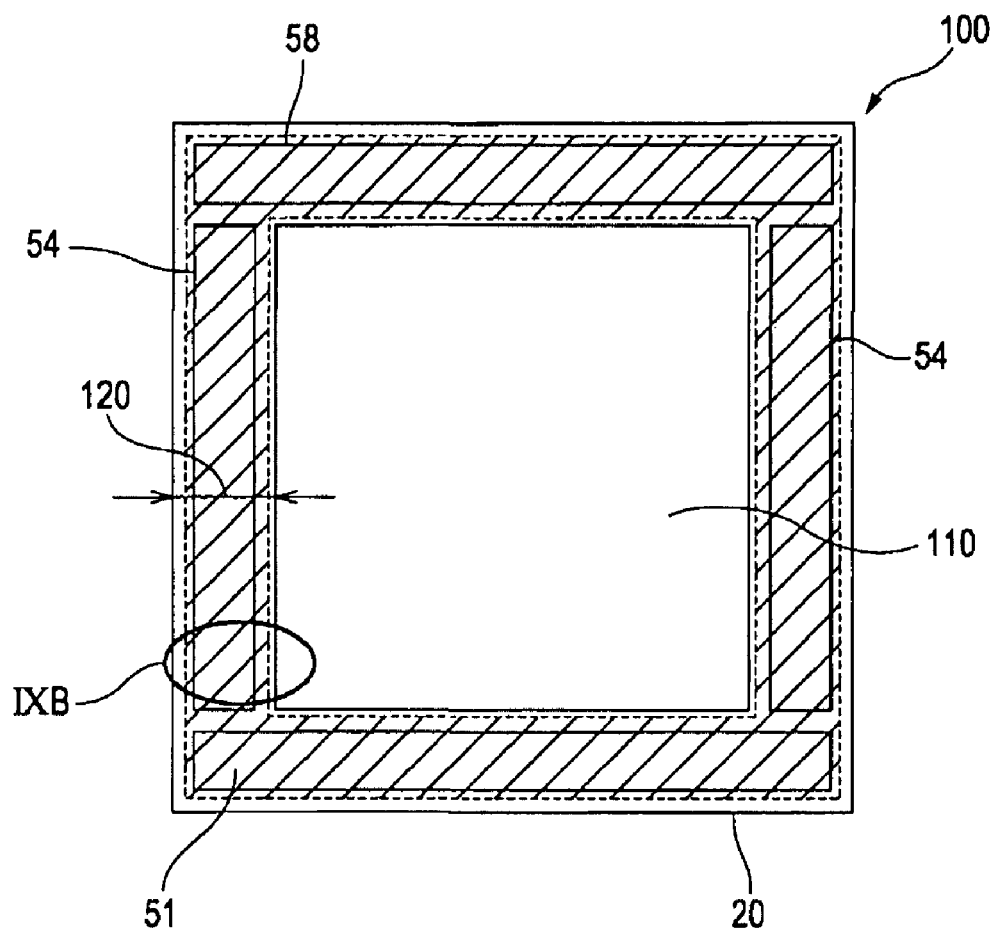
FIG. 9A is an illustration showing a region, included in the EL device of the third embodiment, for removing moisture.
Figure 9B:
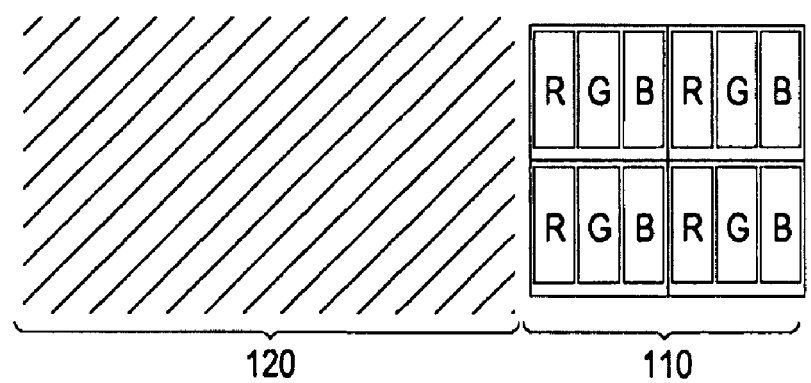
FIG. 9B is an illustration showing another region, included in the EL device of the third embodiment, for removing moisture.
Figure 10:
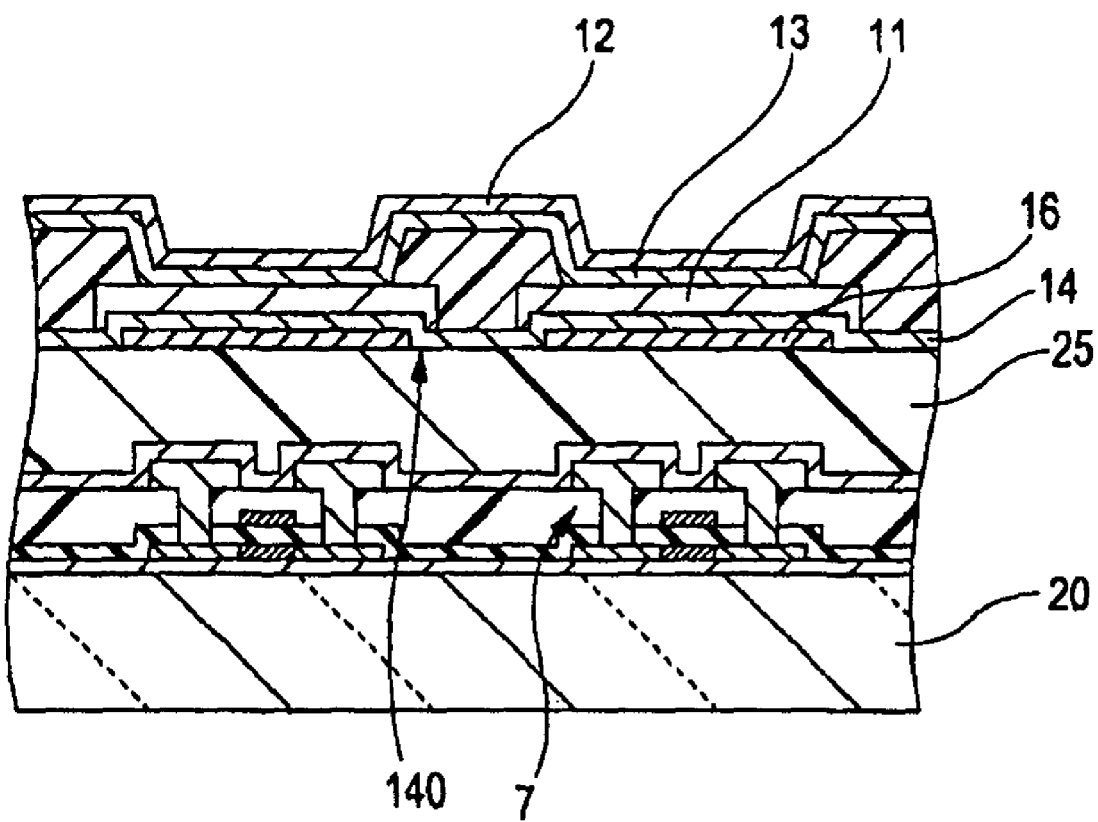
FIG. 10 is an illustration showing a conventional EL device.

An EL device according to a third embodiment of the present invention will now be described. FIG. 8A is a sectional view of a principal part of the EL device. FIG. 8B is an enlarged sectional view of the principal part thereof. FIG. 8C is a sectional view of the EL device including partitions. FIGS. 8A, 8B, and 8C correspond to FIGS. 3A, 4A, and 4B, respectively. FIGS. 9A and 9B are illustrations showing regions, included in the EL device, for removing moisture. The EL device of this embodiment has a configuration similar to that of the EL device of the first embodiment. Hence, the same components shown in these figures have the same reference numerals and are not described in detail.

With reference to FIGS. 8A and 8B, the EL device is represented by reference numeral 100. The EL device 100 of this embodiment, as well as the EL device 100 of the first embodiment, is a top emission type and therefore a region for forming reflective layers 16 and first electrode layers 11 needs to be planarized. Hence, an organic planarization layer 25 lies above a substrate 20 to cover irregularities caused by second thin-film transistors 7. The organic planarization layer 25 is thick and contains a photosensitive resin such as an acrylic resin. The reflective layers 16 are arranged on the organic planarization layer 25 so as to correspond to respective sub-pixels 15. The reflective layers 16 are made of aluminum or an aluminum alloy and spaced from each other.

The EL device 100 of this embodiment is different from the EL device 100 of the first embodiment in that a protective layer 14 containing silicon nitride extends over a light-emitting region 110 to cover the reflective layers 16.

First electrode layers 11 serving as anodes or pixel electrodes are arranged on the protective layer 14 in a spaced manner. The first electrode layers 11 are light-transmissive and conductive and contain indium tin oxide (ITO) or the like. An organic light-emitting layer 13 containing a high- or low-molecular-weight material lies over the first electrode layers 11. The organic light-emitting layer 13 is shared by sub-pixels 15. A second electrode layer 12 having a small thickness lies over the organic light-emitting layer 13. The second electrode layer 12 contains calcium or aluminum, serves as a cathode, and is shared by the sub-pixels 15. The sub-pixels 15 include respective organic EL elements 10 including the first electrode layers 11, portions of the second electrode layer 12, and portions of the organic light-emitting layer 13 sandwiched between the first electrode layers 11 and the second electrode layer 12. In this embodiment, the first electrode layers 11 have different thicknesses depending on colors to which the sub-pixels 15 correspond.

Partitions 5 containing an acrylic resin are arranged on the organic planarization layer 25 such that the partitions 5 are partly disposed on the first electrode layers 11. The partitions 5 extend along the boundaries between the sub-pixels 15. Since the protective layer 14 extends over the light-emitting region 110, the partitions 5 unlike those described in the first embodiment are not in contact with portions of the organic planarization layer 25 that are located in the light-emitting region 110. A sealing layer 19 containing silicon nitride lies on the second electrode layer 12 to protect the organic light-emitting layer 13 and the second electrode layer 12 from moisture and oxygen. A sealing substrate 8 is disposed above the substrate 20 with an adhesive layer 9 disposed therebetween.

In this embodiment, driving-circuit thin-film transistors 50 included in data line-driving circuit 51 or scanning line-driving circuits 54 shown in FIG. 2 are arranged on portions of a protective base layer 21 that are located in a non-light-emitting region 120. The driving-circuit thin-film transistors 50 have substantially the same configuration as that of the second thin-film transistors 7. Therefore, in the non-light-emitting region 120, a gate insulating layer 22, an interlayer insulating layer 23, and a passivation layer 24 are arranged above the substrate 20 in that order.

In this embodiment as well as the first embodiment, the organic planarization layer 25 extends from the light-emitting region 110 to the non-light-emitting region 120. However, the protective layer 14 is disposed only in the light-emitting region 110. Therefore, the organic planarization layer 25 has an upper portion which is located in the non-light-emitting region 120 and which is exposed from the protective layer 14. The sealing layer 19 extends in the non-light-emitting region 120 as well as the light-emitting region 110. The edge of the organic planarization layer 25 is located slightly inside the edge of a substrate 20. Therefore, in the non-light-emitting region 120, the upper face and side faces of the organic planarization layer 25 are covered with the sealing layer 19.

In order to manufacture the EL device 100 having the above configuration, the following layers and partitions are formed in this order: the organic planarization layer 25, the reflective layers 16, the protective layer 14, the first electrode layers 11, the partitions 5, and the organic light-emitting layer 13. Therefore, the situation between the step of forming the partitions 5 and the step of forming the organic light-emitting layer 13 is as shown in FIG. 8C. The upper portion of the organic planarization layer 25 that is located in the non-light-emitting region 120 is exposed.

Therefore, after the partitions 5 are formed as shown in FIG. 8C, moisture can be removed from the organic planarization layer 25 and the partitions 5 in such a manner that the substrate 20 is subjected to dehydration (baking) at a predetermined temperature, for example, about 200° C., in a vacuum, although the reflective layers 16, the protective layers 14, and the first electrode layers 11 are arranged on the organic planarization layer 25. That is, moisture contained in the partitions 5 is removed as indicated by Arrow H13 in FIG. 8C. Moisture contained in portions of the organic planarization layer 25 that are located in the non-light-emitting region 120 is removed as indicated by Arrow H11. Moisture contained in portions of the organic planarization layer 25 that are located in the light-emitting region 110 is transferred from the light-emitting region 110 toward the non-light-emitting region 120 as indicated by Arrow H10 and then removed as indicated by Arrow H11.

In the light-emitting region 110, the organic planarization layer 25 is covered with the protective layer 14; hence, the moisture contained in the organic planarization layer 25 is not removed through the light-emitting region 110. As shown in FIGS. 9A and 9B, moisture can be removed the organic light-emitting layer 13 through the non-light-emitting region 120, which is wide.

Other Embodiments

In the first to third embodiments, the partitions 5 are used. However, the partitions 5 need not be necessarily used. In this case, an EL device according to a preferred embodiment of the present invention can be manufactured in such a manner that an organic planarization layer, reflective layers, a protective layer, and first electrode layers are formed in that order, dehydration is performed, and an organic light-emitting layer is then formed. Alternatively, if partitions are formed in advance of the formation of first electrode layers, dehydration may be performed subsequently to the formation of the first electrode layers before an organic light-emitting layer is formed.

In each of the first to third embodiments, the organic light-emitting layer 13 is shared by the sub-pixels 15. An EL device according to a preferred embodiment of the present invention may include organic light-emitting layers, spaced from each other, corresponding to sub-pixels.

Electronic Apparatus

The EL device 100 according to any one of the above embodiments can be used as a display unit or exposure head for use in an electronic apparatus. Examples of the electronic apparatus include mobile phones, personal computers, PDAs, and image-forming apparatuses such as digital copiers and printers.

What is claimed is:

1. An electroluminescent device comprising:
a substrate;
a light-emitting region including a plurality of sub-pixels including switching elements, portions of an organic planarization layer for covering irregularities caused by the switching elements, reflective layers arranged on the organic planarization layer, protective layers extending over the respective reflective layers, the protective layers having insulative properties, light-transmissive first electrode layers which lie on the respective protective layers and which are electrically connected to the switching elements, portions of an organic light-emitting layer lying over the first electrode layers, and portions of a second electrode layer lying on the organic light-emitting layer; and
a non-light-emitting region located outside the light-emitting region,
wherein the light-emitting region and the non-light-emitting region are arranged on the substrate and the organic planarization layer extends from the light-emitting region to the non-light-emitting region and has an upper portion which is located in the non-light-emitting region and which is exposed from the protective layers.

2. The electroluminescent device according to claim 1, further comprising a driving circuit, arranged below a zone of the organic planarization layer that is located in the non-light-emitting region, for driving the sub-pixels.

3. The electroluminescent device according to claim 1, further comprising partitions which are arranged on the organic planarization layer, which extend along the boundaries between the sub-pixels, and which are parts of a resin layer.

4. The electroluminescent device according to claim 3, wherein the resin layer extends from the light-emitting region to the non-light-emitting region and lies on the organic planarization layer.

5. The electroluminescent device according to claim 3, wherein the partitions and the organic planarization layer contain the same resin.

6. The electroluminescent device according to claim 3 wherein the protective layers are spaced from each other so as to correspond to the sub-pixels and the partitions are in contact with portions of the organic planarization layer that are located at the boundaries between the protective layers adjacent to each other.

7. A method for manufacturing the electroluminescent device according to claim 3, comprising:
forming the organic planarization layer;
forming the reflective layers;
forming the protective layers;
forming the first electrode layers;
forming the partitions; and
forming the organic light-emitting layer,
wherein after the partitions are formed, dehydration is performed in advance of the formation of the organic light-emitting layer such that moisture is removed from the organic planarization layer and the partitions.

8. The electroluminescent device according to claim 1, wherein the sub-pixels correspond to predetermined colors and the first electrode layers have different thicknesses depending on the predetermined colors.

9. An electronic apparatus comprising the electroluminescent device according to claim 1.

10. A method for manufacturing the electroluminescent device according to claim 1, comprising:
forming the organic planarization layer;
forming the reflective layers;
forming the protective layers;
forming the first electrode layers; and
forming the organic light-emitting layer,
wherein after the first electrode layers are formed, dehydration is performed in advance of the formation of the organic light-emitting layer such that moisture is removed from the organic planarization layer.

11. An electroluminescent device comprising:
a substrate;
an organic planarization layer disposed above the substrate;
a reflective layer disposed above the organic planarization layer;
a protective layer disposed on the reflective layer;
a plurality of first electrodes disposed on the protective layer;
a light-emitting layer disposed above the first electrodes;

a second electrode disposed above the light-emitting layer;

a light-emitting region including a plurality of sub-pixels, each of the sub-pixels having the first electrode, the light-emitting layer, and the second electrode;

a non-light-emitting region located outside the light-emitting region; and the organic planarization layer being formed in the light-emitting region and the non-light-emitting region;

the protective layer which is located in the light-emitting region covering the organic planarization layer and the reflective layer so as not to expose an upper surface of the organic planarization layer;

the upper surface of the organic planarization layer which is located in the non-light-emitting region being exposed from the protective layer.

* * * * *